United States Patent
Klee et al.

(10) Patent No.: US 7,838,965 B2
(45) Date of Patent: Nov. 23, 2010

(54) ESD PROTECTED INTEGRATED CAPACITOR WITH LARGE CAPACITY

(75) Inventors: Mareike Klee, Straelen (DE); Rainer Kiewitt, Roetgen (DE); Ulrich Schiebel, Aachen (DE); Hans-Wolfgang Brand, Aachen (DE); Ruediger Mauczok, Erkelenz (DE)

(73) Assignee: NXP B.V., Eindhoven (NL)

( * ) Notice: Subject to any disclaimer, the term of this patent is extended or adjusted under 35 U.S.C. 154(b) by 321 days.

(21) Appl. No.: 11/817,706

(22) PCT Filed: Feb. 27, 2006

(86) PCT No.: PCT/IB2006/050604

§ 371 (c)(1),
(2), (4) Date: May 21, 2008

(87) PCT Pub. No.: WO2006/092756

PCT Pub. Date: Sep. 8, 2006

(65) Prior Publication Data

US 2008/0258257 A1    Oct. 23, 2008

(30) Foreign Application Priority Data

Mar. 2, 2005  (EP) .................................. 05101597

(51) Int. Cl.
*H01L 29/00* (2006.01)

(52) U.S. Cl. ................. 257/532; 257/360; 257/356; 257/E29.044; 361/56

(58) Field of Classification Search ......... 257/355–360, 257/532
See application file for complete search history.

(56) References Cited

U.S. PATENT DOCUMENTS

| 4,759,823 | A | | 7/1988 | Asselanis et al. |
| 5,225,702 | A | * | 7/1993 | Chatterjee .................. 257/360 |
| 5,801,065 | A | | 9/1998 | Rizvi et al. |
| 6,064,108 | A | | 5/2000 | Martinez |
| 2004/0155692 | A1 | | 8/2004 | Ochi |

FOREIGN PATENT DOCUMENTS

| EP | 1351304 A2 | 10/2003 |
| JP | 2000101022 A | 4/2000 |
| WO | 198907334 A1 | 8/1989 |
| WO | 200275780 A2 | 9/2002 |
| WO | 2003065458 A2 | 8/2003 |
| WO | 2004057688 A1 | 7/2004 |
| WO | 2006008680 A1 | 1/2006 |

* cited by examiner

*Primary Examiner*—Dung A. Le

(57) ABSTRACT

The integrated capacitor structure comprises a first branch with a first capacitor (60) and a second branch with a second capacitor (70). The second capacitor (70) has a higher capacitance density and a lower breakdown voltage than the first capacitor (60). The first branch has a shorter RC time constant than the second branch, such that a voltage peak will substantially follow the first branch. This first capacitor (60) has a sufficient capacity to store the charge of the voltage peak. In one embodiment, the second capacitor (70) is a stacked capacitor. The structure is suitable for ESD-protection and may, to this end, additionally comprise diodes (21) and resistors (22).

15 Claims, 5 Drawing Sheets

ESD PROTECTED INTEGRATED CAPACITOR WITH LARGE CAPACITY

The invention relates to an electronic device provided with a capacitor having a first dielectric layer and a high capacitance density.

Such a device is known from U.S. Pat. No. 6,064,108. This document discloses a multilayer film capacitor structure with a plurality of capacitor electrodes stacked on top of each other and spaced apart by dielectric layers. The resulting capacitor structure has a relatively high capacitance density in comparison to a thin-film capacitor with merely two electrodes. Nevertheless, it can be suitably made in a CMOS fabrication process.

It is a disadvantage of the known device that the capacity is enhanced, but the breakdown voltage is relatively limited. Inherently, there is an inverse relation between the capacitance and the breakdown voltage of a capacitor, in that with increasing thickness of the dielectric layers the breakdown voltage is enhanced, but the capacitance density is reduced. Obviously, the stacking of the capacitor electrodes allows an improvement of the capacitance without a loss in breakdown, as the effective area is doubled. However, stacking does not result in a higher breakdown voltage.

It is therefore an object of the invention to provide a device of the kind mentioned in the opening paragraph with an enhanced breakdown voltage, yet without a reduction of the capacity.

This object is achieved in that the device comprises an integrated capacitor structure with an input and at least one output, which structure comprises a first branch and a second branch, which first branch is coupled between the input and the output of the structure and comprises a first capacitor, and which second branch is coupled to the input and comprises a second capacitor with a higher capacitance density and a lower breakdown voltage than the first capacitor, and wherein the first branch has a shorter RC time constant than the second branch, such that a pulsed voltage peak will substantially follow the first branch, the first capacitor having sufficient capacity to store the charge of the voltage peak.

It was found in experiments leading to the invention that the portion of the capacitor that is located adjacent to the input and the output is more vulnerable to breakdown after a pulsed voltage peak than a portion located further away from the input and the output. Basically, by splitting these portions into individual capacitors, the problem was solved: a first capacitor with a high breakdown is combined with a capacitor with a high capacitance density in such a manner that the pulsed voltage peak will flow away through the first capacitor, and breakdown of the second capacitor can be prevented. The operation of this combination is based on the insight that the current flow of a pulsed voltage peak is a kinetic effect: out of two parallel branches, that one is chosen which reacts fastest.

An additional requirement to be fulfilled by the first capacitor is that its capacity should be sufficiently large to store the charge of the voltage peak. Otherwise, the voltage peak will flow through the second capacitor, with the concomitant risk of breakdown of the latter. The capacity needed is of course dependent on the speed and the voltage of the voltage peak, as it is generally known that the capacity is equal to the ratio of stored charge and voltage applied across the capacitor. Preferably, the capacity of the first capacitor is at least 10 pF, more preferably at least 100 pF, and most preferably at least 500 pF.

The requirement of 'faster branches' is electrically expressed in the RC time constant. This constant, which comprises the effective capacitance and the series resistance, is a measure of the speed at which a current may flow away. It must be smaller for the first branch than for the second branch. Suitably, an additional resistance is included so as to enlarge the RC time of the second branch. In one embodiment, the second branch comprises an additional resistor between the input and the second capacitor. In another embodiment, the top electrode material has a sufficient resistance, so that the second branch includes an additional resistance. Alternatively, the resistor may be connected behind the second capacitor as a suitable load. The additional resistor suitably has a value between 0.1 and 100Ω, preferably in the range of 1 to 10Ω.

It is observed that a pulsed voltage peak, such as a pulse resulting from electrostatic discharge (ESD), is really a dynamic phenomenon. The requirement of a shorter RC time for the first branch, is thus to be understood in dynamic terms as well. That is to say: at any infinitely small moment within a voltage pulse, at which part of the charge of the voltage peak has already filled the capacitor of the first branch, the first branch should nevertheless be faster. In fact, the functional requirement of the (current) flow of the voltage peak through the first branch is most important. The implementation for any specific system is generally controlled and elaborated with simulations on the basis of differential equations.

Preferably, the first and second capacitors are constructed from the same layers, i.e. the first dielectric layer of the second capacitor is part of the dielectric of the first capacitor. This reduces the number of processing steps.

In a further embodiment, the second capacitor is a stacked capacitor, in which the first dielectric layer is present between a first electrode and an intermediate electrode and a second dielectric layer is present between a second electrode and the intermediate electrode, and in which capacitor the first and second electrode are mutually coupled. The use of a stacked capacitor with an intermediate electrode as the second capacitor has the advantage that the capacitance is easily doubled. Moreover, the improvement of the breakdown is substantial; preferably, the second capacitor has a surface area that is at least 1.5 times, more preferably even twice that of the first capacitor, and optionally even three or five times as large.

In a particular modification, the first dielectric comprises both the first and the second dielectric layers. This has the advantage that virtually no additional masks are needed in comparison to the manufacture of a single, stacked capacitor.

Most suitably, the first and the second dielectric layers comprise ferroelectric material. This type of material has a high dielectric constant and can be processed in a manner known per se in the semiconductor industry.

In an alternative embodiment, the second capacitor is a trench capacitor. This type of capacitor provides a high capacitance density, but its breakdown behaviour is insufficient for several applications, particularly if such a trench capacitor is stacked. By combining the trench capacitor and a capacitor with a high breakdown voltage according to the invention, the trench capacitor can be applied for a larger range of applications. The high breakdown capacitor is suitably a thin-film capacitor that is provided on the substrate surface.

Suitably, the electronic device of the present invention comprises semiconductor elements, such as transistors and diodes. It may be an integrated circuit comprising a plurality of transistors interconnected according to a desired circuit topology, and present on a semiconductor substrate. Alternatively, the electronic device may be a peripheral device which is designed for a specific function, and which comprises a plurality of passive elements optionally in combination with a small number of active components.

Although the capacitor structure may be used for a variety of applications, it is particularly suitable for use in an ESD-protection circuit.

Very high breakdown voltages are needed for this type of circuit, for instance up to 60 V. ESD protection circuits are embodied as part of integrated circuits, but also as separate entities, for instance as combinations of diodes, capacitors and resistors. The latter circuits are particularly aimed at protection against ESD-pulses of a very high voltage, for instance 4, 8 or even 16 kV. At such voltages, the normal breakdown properties are not sufficient. Suitably, these devices also have a filtering function by an integrated circuit of pi-topology or RC or LC- or CLC-configuration. For such a filtering function, high capacitance densities are advantageous, both for reduction of size and for specific applications. In this ESD-application, the first capacitor is suitably connected to ground.

In a preferred application, the second capacitor is coupled to a further output of the structure as part of a signal path. In this configuration, the second capacitor is used as a filter to improve the signal/noise ratio. It is however not excluded that the first and the second capacitor are connected in parallel. In the ESD-application, these are then both connected to ground, but that is not strictly necessary for other applications. Alternatively, the second capacitor may form part of a larger circuitry section that is connected in parallel to the first capacitor.

In a specific embodiment, it is used for AC coupling of an audio or video signal, such as that of a microphone channel. Particularly for audio signals, it is very important to have sufficient bandwidth. Such AC coupling is particularly needed if also a DC/AC converter is present. The minimum capacitance needed for the signal/noise ratio filtering is then determined by the lower corner frequency. This results in a capacitor having a value that is preferably in the order of 50-70 nF, which capacitor also meets the stringent breakdown requirements within the ESD-protection circuits. Standard analog video signals have a bandwidth of 5.5 MHz, starting at about 15 kHz. Also here the lowest frequencies determine the minimum capacitor value. The standard voltage level is 1 Vrms.

In an alternative specific embodiment, the second capacitor is used for AC coupling of data signals. These signals are typically in the range from 1 V to 3.3 V. The signal frequencies can differ very much depending on the application (100 kHz up to 1 GHz).

In a second application, the second capacitor is coupled to the output of the structure, this output being coupled to ground. Herein, it is primarily used as a part of the ESD-protection functionality.

In a suitable embodiment hereof, the input of the capacitor structure is coupled to a contact pad of the electronic device, which contact pad is designed to provide a connection from the electronic device to another electronic device with a system. ESD-protection is needed for two reasons in general. First of all, ESD pulses may appear as a result of external exposure. This is primarily due to contact at a user interface of a consumer electronics device, such as a keyboard, a microphone, a display, a camera and the like. Secondly, ESD pulses may appear during the assembly process. Since the device is generally assembled only once, it is in principle sufficient if one ESD pulse can be directed away from the bond pad, when the contact pad does not have a connection to a user interface. Therefore, in general, all input and output connections should have an ESD-diode, because during assembly an ESD event can occur between any pins (bumps) of the device. There is no clear input and output pin defined. However, the ESD-pulses are much lower during assembly (up to 400V-500V; much lower than kV), so that those diodes can be much smaller.

Even a capacitor with a sufficiently high breakdown voltage could well be used as a first trap of the ESD-protection, particularly against the electrostatic discharge occurring during assembly. The second capacitor would then act as a second trap. This embodiment of an ESD-protection circuit allows the design freedom to choose between diodes, transistors and capacitors. However, it will be understood that in many cases the active element is preferred in view of the fact that it allows clamping, e.g. a limitation of the voltage.

Although the invention has been discussed on the basis of one capacitor structure being present in the device, it is not excluded that more than one capacitor structure is present therein. The structure may be functionally independent or functionally coupled.

Although the embodiment with a second stacked capacitor is discussed and shown in the Figures, it is not excluded that a stacked capacitor may include more than two dielectric layers. Although the embodiments shown in the Figures disclose a capacitor structure, wherein the second capacitor is located adjacent to the first capacitor, a single stacked structure is not excluded. In such a structure, the input is formed by an intermediate electrode. The first capacitor is provided on one side of this intermediate electrode. The second capacitor is defined on the opposite side of the intermediate electrode. Any additional resistor needed to provide the second branch with a longer RC time could be connected behind the second capacitor, or could be integrated as a resistor layer.

The device of the invention can be suitably used in an assembly in which an integrated circuit is assembled to the top side in a configuration known as "stacked die-configuration". The reverse situation, wherein the device of the invention is assembled to the top side of an integrated circuit, may be an appropriate alternative, particularly if the integrated circuit has a larger surface area than the device of the invention. Preferably, the two dies are mutually connected by means of a bumped connection. They may be combined in a package usually referred to as "chip-scale package". Additionally, resistors may be present, as is known and further explained in the non-prepublished application EP 04103327.5 (PHNL040812). Packages other than the chip-scale packages with bumped connections are not excluded however; a suitable alternative is, for instance, a leadframe-based stacked die package known from WO-A 2004/057688 or packages in which at least part of the connection is provided with bond wires.

These and other aspects of the device of the invention will be further elucidated with reference to the drawings, in which.

The Figures are not drawn to scale and are purely diagrammatical. Equal reference numerals in different figures refer to like parts. The Figures are illustrative and provide examples of the invention. Other examples will be apparent to the skilled person in the art.

Figure 1:
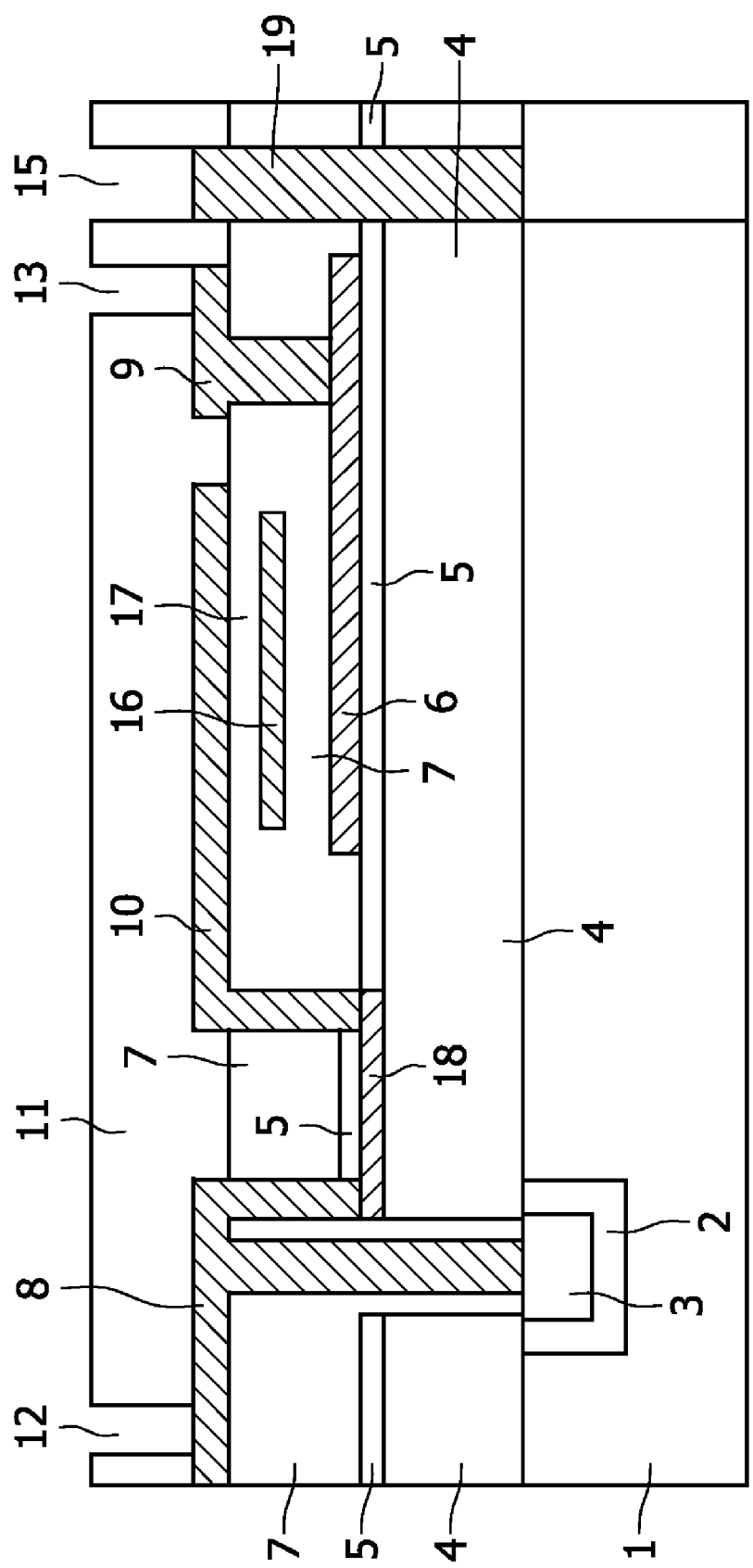
FIG. 1 shows a cross-sectional view of a first embodiment of the device.
Figure 2:
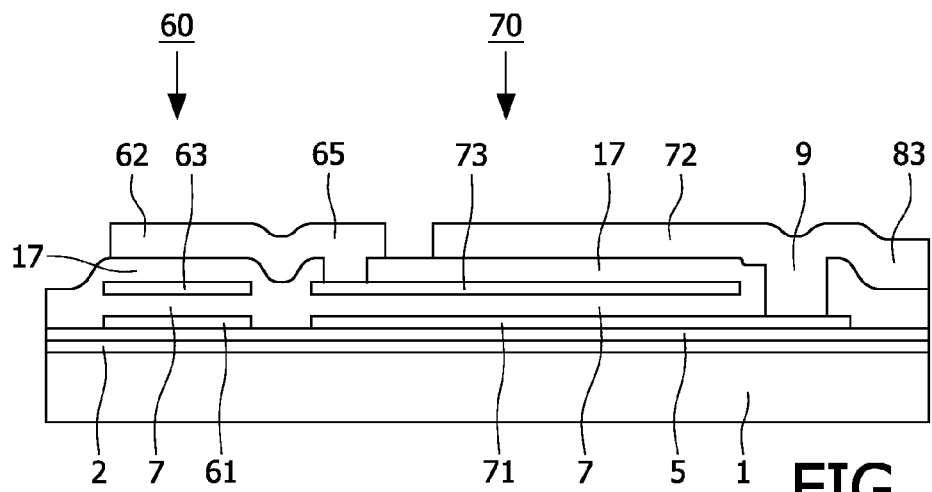
FIG. 2 shows another cross-sectional view of the first embodiment.
Figure 4:
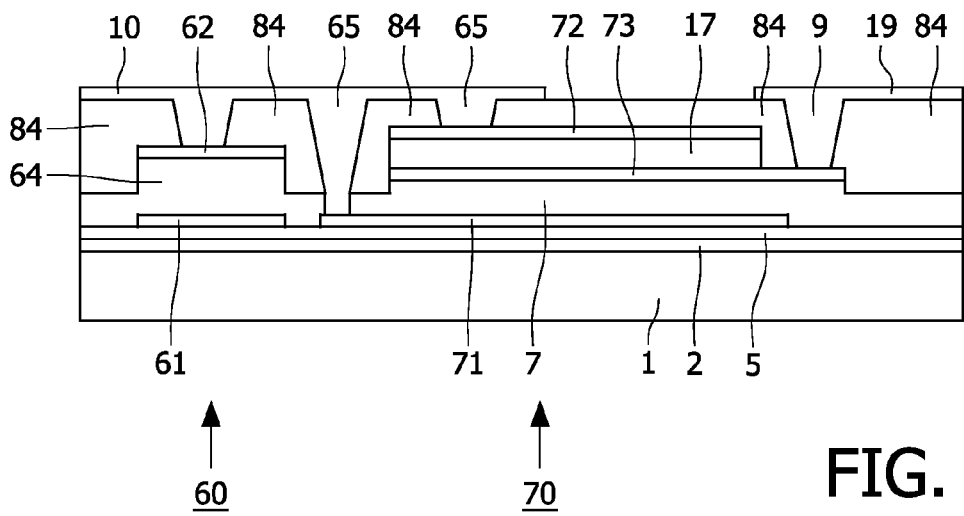
FIG. 4 shows a cross-sectional view of a third embodiment of the device.
Figure 5:
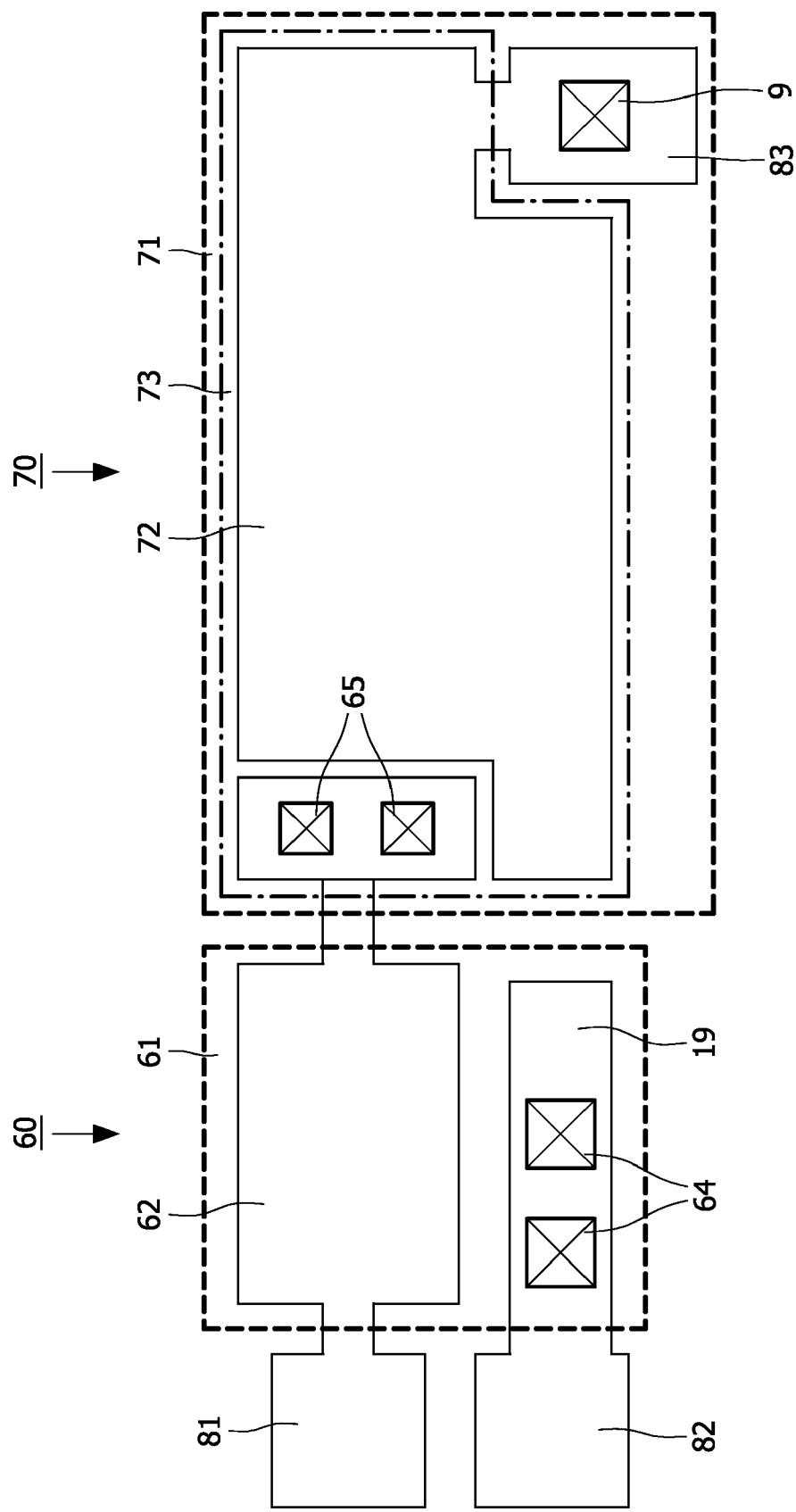
FIG. 5 shows a top view of the first embodiment.
Figure 6:
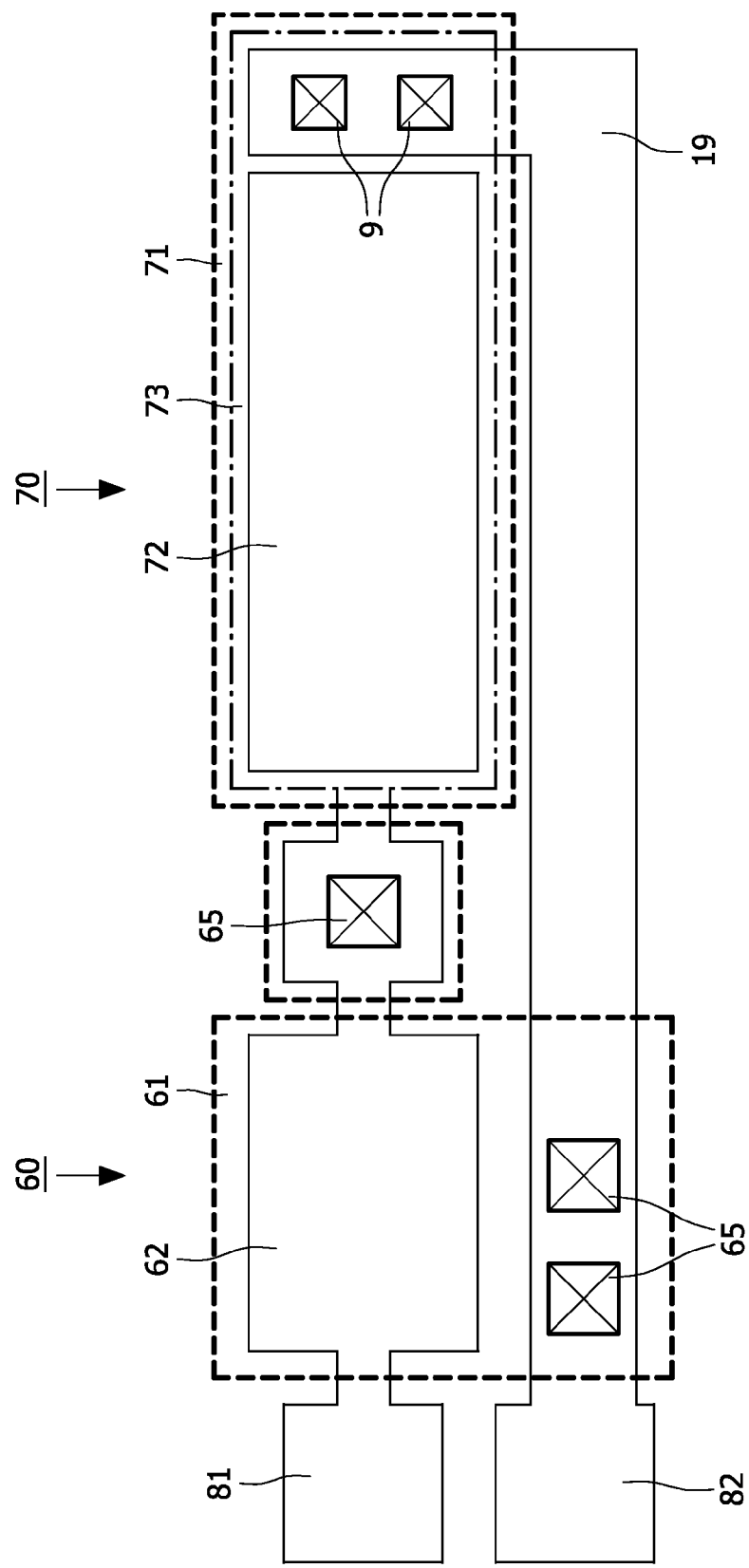
FIG. 6 shows a top view of a fourth embodiment of the device, similar to the third embodiment.
Figure 7:
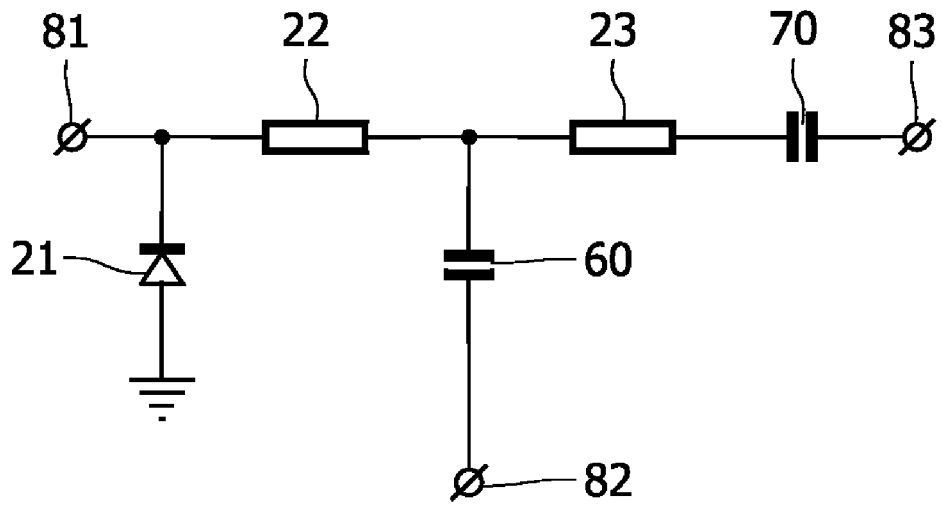
FIGS. 7-8 show electrical diagrams for the device of the invention.
Figure 8:
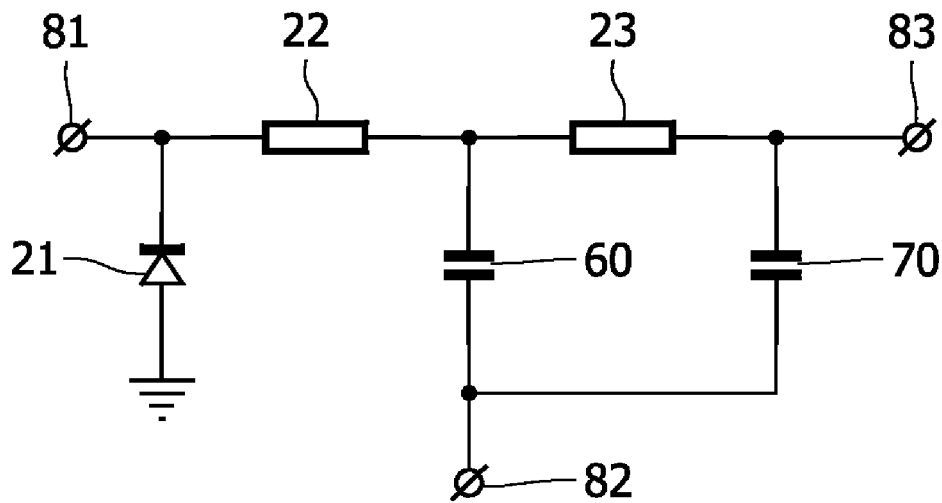

FIG. 1 shows an example device of the invention. It is not in any case meant to be limiting, and it is purely diagrammatical. For the manufacture of an electronic component as shown in FIG. 1, a semiconductor substrate 1 was provided with first semiconductor regions 2 and second semiconductor regions 3. The substrate 1 was doped with B as the dopant of a first doping type. The first semiconductor regions 2 were doped with B in a lower doping density. The second semiconductor regions 3 were doped with P as the dopant of the second doping type. An insulating layer 4 of, for instance, $SiO_2$, Si3N4 or a combination of Si3N4 and SiO2 is provided on the semiconductor substrate 1. The insulating layer 4 can be covered by a barrier layer 5 of $TiO_2$ or $ZrO_2$ or $Al_2O_3$ or MgO or a combination of Si3N4 and $TiO_2$. Particularly $TiO_2$ is suitable. Thereon, a patterned, first, electrically conductive layer 6 is provided, for instance comprising Pt, in a layer thickness of 50 nm to 1 µm. Other metals may be used alternatively. Additional layers, for instance of Ti, may be present for improvement of adhesion. Other metals and metal stacks may be used alternatively, such as, TiW/Pt, Ta/Pt, W, Ni, Mo, Au, Cu, Ir, IrO2/Ir, Ti/Pt/Al, Ti/Ag, Ti/Ag/Ti, Ti/Ag/Ir, Ti/Ir, Ti/Pd, Ti/Ag$_{1-x}$Pt$_x$ ($0≦x≦1$), Ti/Ag$_{1-x}$Pd$_x$ ($0≦x≦1$), Ag$_{1-x}$Pt$_x$ ($0≦x≦1$), Ti/Pt$_{1-x}$Al$_x$ ($0≦x≦1$), Pt$_{1-x}$Al$_x$ ($0≦x≦1$), Ti/Ag/Pt$_{1-x}$Al$_x$ ($0≦x≦1$), Ti/Ag/Ru, Ru, Ru/RuO$_2$, Ti/Ru, Ti/Ir, Ti/Ir/IrO$_2$, Ti/Ru/Ru$_x$Pt$_{1-x}$($0≦x≦1$), Ti/Ag/Ir/IrO$_y$ ($0≦x≦2$), Ti/Ag/Ru/RuO$_x$ ($0≦x≦2$), Ti/Ag/Ru/Ru$_x$Pt$_{1-x}$ ($0≦x≦1$), Ti/Ag/Ru/Ru$_x$Pt$_{1-x}$/RuO$_y$ ($0≦x≦1$, $0≦y≦2$), Ti/Ag/Ru/RuO$_x$/Ru$_y$Pt$_{1-y}$($0≦x≦2$,$0≦y≦1$), Ti/Ag/Ru$_x$Pt$_{1-x}$ ($0≦x≦1$), Ti/Ag/Pt$_x$Al$_{1-x}$ ($0≦x≦1$), Pt$_x$Al$_{1-x}$/Ag/Pt$_y$Al$_{1-y}$ ($0≦x≦1$, $0≦y≦1$), Ti/Ag/Pt$_y$(RhO$_x$)$_{1-y}$ ($0≦x≦2$, $0≦y≦1$), Ti/Ag/Rh/RhO$_x$ ($0≦x≦2$), Rh, Rh/RhO$_2$, Ti/Ag/Pt$_x$Rh$_{1-x}$ ($0≦x≦1$), Ti/Ag/Pt$_y$(RhO$_x$)$_{1-y}$/Pt$_z$Rh$_{1-z}$ ($0≦x≦2$, $0≦y≦1$, $0≦z≦1$), Ti/Ag$_x$Pt$_{1-x}$/Ir ($0≦x≦1$), Ti/Ag$_x$Pt$_{1-x}$/Ir/IrO$_y$ ($0≦x≦1$, $0≦y≦2$), Ti/Ag$_x$Pt$_{1-x}$/Pt$_y$Al$_{1-y}$ ($0≦x≦1$, $0≦y≦1$), Ti/Ag$_x$Pt$_{1-x}$/Ru ($0≦x≦1$), Ti/Ag$_x$Pt$_{1-x}$/Ru/RuO$_y$($0≦x≦1$,$0≦y≦2$), Ti/Ag/Cr, Ti/Ag/Ti/ITO, Ti/Ag/Cr/ITO, Ti/Ag/ITO, Ti/Ni/ITO, Ti/Rh, Ti/Rh/RhO$_2$. The first electrically conductive layer 6 comprises first electrodes of a first and a second capacitor, as will be shown and explained in more detail with reference to the FIGS. 2-4. A top view corresponding to FIG. 2 is shown in FIG. 5. A top view of a device similar to that of FIG. 4 is shown in FIG. 6. Electrical diagrams corresponding to FIG. 1 are shown in FIGS. 7-9.

A first dielectric layer 7 is present on the first electrically conductive layer 6, as well as on the barrier layer 5 at locations where the first conductive layer 6 is absent. A preferred example is a complex oxide layer 7, for instance a ferroelectric layer of Pb$_{1-y}$La$_y$Zr$_{1-x}$Ti$_x$O$_3$, with $0.00≦y≦0.20$ and $0.0≦x≦1.0$. Other complex oxide layers having a relatively high dielectric constant are known to the skilled person and include materials such as barium strontium titanate, lead titanate-lead manganese niobium. Other materials such as tantalum oxide, hafnium oxide or silicon nitride could be used alternatively. A list of suitable materials has been disclosed in WO-A 02/75780. A nucleation layer with another composition than the first dielectric layer 7 may be applied on the first conductive layer 6 so as to improve adhesion. A suitable nucleation layer is, for instance, a layer of titanium oxide, PbZr$_{1-x}$Ti$_x$O$_3$ or Pb$_{1-y}$La$_y$Zr$_{1-x}$Ti$_x$O$_3$, with x and y in the same range as mentioned above.

An intermediate electrode layer 16 is provided on the first dielectric layer 7 and covered with a second dielectric layer 17. The patterns in this intermediate electrode 16 include an intermediate electrode of the second capacitor, and optionally a floating electrode in the first capacitor. Suitably, also the second dielectric layer 17 comprises a complex oxide layer, and more suitably, this is—at least for the major part—the same material as that of the first dielectric layer 7. Use of the same material is understood to provide a most regular structure of the dielectric and is therefore preferred. The structure of the dielectric influences both the breakdown and dielectric properties positively. Use of another nucleation layer is not excluded. The material of this intermediate electrode layer 16 is preferably the same as that of the first conductive layer 6. Adhesion layers for the intermediate electrode are most likely not used but could be used, if necessary. The growth of the (poly)crystalline ferroelectric layers is dependent on the substrate structure. A floating electrode would be undesirable, because adjacent portions of the dielectric have a different support. However, it is believed that with the use of the same material for first conductive layer and intermediate layer, the structure of the dielectric on the floating electrode and the structure of the dielectric adjacent to the floating electrode will be very similar or even identical.

With the use of a complex oxide layer as the dielectric layers 7,17, the use of Pt as electrode material is preferred. With alternative sintering techniques, particularly with post-treatments under reducing atmosphere, other metals such as Cu, Ag or Ni can be applied for the conducting layers 6,16. Conductive oxides, such as RuOx or IrO2, or conductive oxides with a perovskite lattice, such as La,SrRuO3, constitute another suitable alternative. Particularly, when the complex oxide layers are provided in a wet-chemical manner, such as with sol-gel technology, the structure of the layers has been found to be very good, and also the adhesion is excellent.

Contact holes reaching down to the semiconductor substrate 1 were made after the etching of the first and second dielectric layers 7, 17 with conventional etchants that are specific to the layers. The contact holes were filled with a conductive material, such as Al, Cu, Pt or an alloy of Al and Cu or of Al and Si or combinations of Ti and Al or Ti and Cu or Ti and an alloy of Al and Cu or of Ti and Al and Si or combinations of TiW and Al or TiW and Cu or TiW and an alloy of Al and Cu or of Al and Si or combinations of TiW or TiWN—both also referred to as TiW(N)—and Al or TiW(N) and Cu or TiW(N) and an alloy of Al and Cu or Al and Si or combinations of TiN and Al or TiN and Cu or TiN and an alloy of Al and Cu or of Al and Si to provide first, second and third supply leads 8,9,19. In this embodiment, use is made of TiW(N) and Al. The conductive material was also provided on top of the complex oxide layer 17 to form a second electrically conductive layer 10, in which the second electrode of the capacitor is defined. Particularly in case that Cu is used as the conductive material, an additional barrier layer, for instance of TaN or TiN, may be provided between the complex oxide layer 17 and the second electrically conductive layer 10. Hereon, a passivation layer 11, in this case of silicon nitride, is present. The passivation layer 11 is provided with contact holes 12, 13 defining "in" 12, "out" 13 and the ground contact 15 of the circuit. Metal or solder bumps are provided to the contact in known manner.

FIG. 2 discloses, in another cross-sectional view, this first embodiment of the device of the invention. In this cross-sectional view, diodes are not present. Although the presence of protection diodes is preferred, it is not essential for the invention. In this Figure, the first capacitor 60 and the second capacitor 70 are shown. The first capacitor 60 comprises a first electrode 61 and a second electrode 62 (in, respectively, the first and the second electrically conductive layers as shown in FIG. 1). The second capacitor 70 is a stacked-type capacitor, with a first electrode 71, a second electrode 72 and an intermediate electrode 73. Through the vertical interconnect or lead 9, the first and second electrode 71, 72 are coupled to an output 83. In this embodiment, they form the output of the capacitor 70, while the intermediate electrode 73 is coupled by means of via 65 to the second electrode 62 of the first capacitor 60. A specific feature is that the second and first dielectric layers 7,17 continue outside the intermediate electrode 73. As such, the vertical interconnect 9 effectively is part of the electrode structure formed by the first and second electrode 71,72. Preferably, the vertical interconnect 9 is designed in such a manner that it effectively is part of this electrode structure. It is believed that the lateral encapsulation of the intermediate electrode by dielectric material is advantageous for the mechanical stability. This encapsulation reduces the number and length of interfaces of the intermediate electrode with any material other than the dielectric material. This reduction of interfaces appears to reduce the number of locations from which cracking or delamination may start, and hence improves the mechanical stability.

Another feature of this first embodiment is the continuity of the first dielectric layer and here, additionally, the second dielectric layer from the first to the second capacitor. Edges of capacitors turn out to be the mechanically weak areas. This is even enhanced in that the capacitors are usually defined—and the edges are provided—by etching. There is always a risk that some etchant is left that may initiate cracks or delamination, particularly under influence of a heat treatment. By extending the dielectric layers there are fewer edges in the capacitor structure.

FIG. 5 shows a top view of the first embodiment. The first electrodes 61,71 in the first electrically conductive layer are indicated by a dashed line. The intermediate electrode 73 of the second capacitor 70 is indicated by a dashed-dotted line. The features in the second electrically conductive layer, particularly the second electrodes 62,72, the input of the capacitor structure 81 and the outputs 82,83 are indicated by continuous lines. For reasons of clarity, the dielectric layers are not indicated in this Figure.

Any voltage pulse enters the structure at the input 81. The input 81 is understood to be connected to a contact pad of the electronic device, in the event that it is part of an ESD-protection circuit. The voltage pulse will arrive at the second electrode 62 of the first capacitor 60. At least a major part of the current is then directly guided to the output 82 of the structure. Suitably, and also in this embodiment, this output is connected to ground, in the form of one contact pad, or through an electrically conducting path through the substrate. This short path to the output is formed by the first capacitor with its first and second electrodes 61,62 and the dielectric (not shown) in between these electrodes 61,62. The short path is led from the first electrode 61 with vias 64 to a supply lead 19 that is coupled to the output 82. In this way, the short path makes use of the second conductive layer 10 that has a lower internal resistance than the first conductive layer.

However, not only a voltage pulse, but also normal signals enter the input 81. The capacitor structure of the invention is thus part of the signal path. This signal path continues through the second capacitor 70 to the further output 83. The second capacitor 70 here forms an AC (Alternating Current)-coupling: only alternating current signals are able to pass, whereas direct current signals are not able to pass. Such a coupling is known per se, and it is suitable here, as noise that may result from voltage pulses, contact resistances, the presence of any diodes or breakdown capacitors and the like, constitutes a direct-current signal. Hence, it can be suitably removed.

The input of the second capacitor 70 is coupled to the input 81 of the structure via the second electrode 62 of the first capacitor 60 and via the vias 65. The input of the second capacitor 70 is constituted by the intermediate electrode 73. The output of the second capacitor 70 is constituted by the first and the second electrodes 71,72 that are coupled by via 9 to the further output 83. Since the voltage pulses are removed by the first capacitor 60, the breakdown requirements of the second capacitor 70 are substantially reduced. At the same time, particularly for applying filtering of audio signals, a very large capacitance is required. This is achieved by said electrode stacking. Additionally, the capacity is enhanced by the use of dielectric layers with a high dielectric constant, preferably more than 1000, relative to air. Although not shown here, the vertical interconnect 9 may have a ring-shaped structure, so as to be present around the intermediate electrode 63 in the manner shown in FIG. 2.

Figure 3:
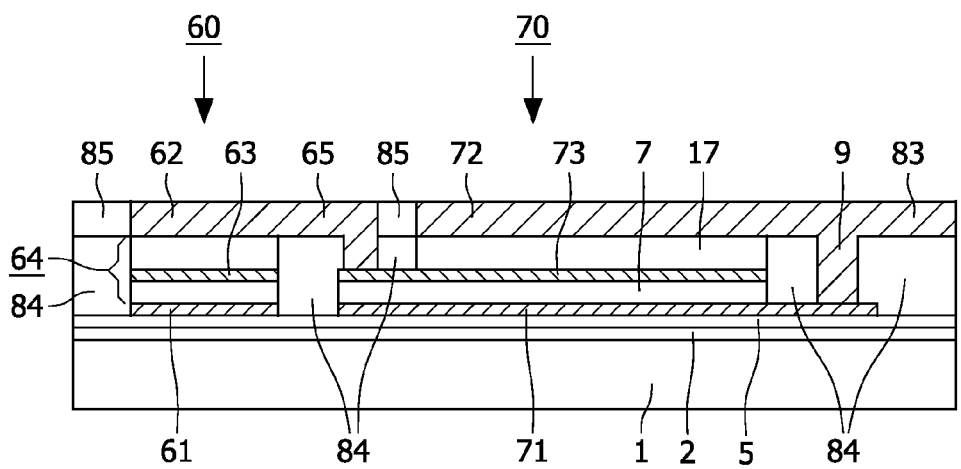
FIG. 3 shows a cross-sectional view of a second embodiment of the device.

FIG. 3 shows in a cross-sectional view a second embodiment of the device of the invention. One major difference with the first embodiment is that the dielectric layers 1,17 shown here are not continuous from the first to the second capacitor 60,70, nor do they extend outside the second capacitor 70. Instead, a planarization layer 84 is applied. The manufacturing of the structure of this embodiment starts with the deposition and patterning of the first electrically conductive layer. The patterning occurs by application of a photolithographic mask and etching accordingly through the mask. Hereafter, the first dielectric layer 7 and the intermediate electrode layer are provided. The intermediate electrode layer is patterned into the floating electrode 63 and the intermediate electrode 73. Then, the second dielectric layer 17 is deposited. In the case of ferroelectric layers, a heat treatment is carried out after deposition, as is known to the person skilled in the art. The heat treatment is preferably carried out after each deposition step. The first and second dielectric layers 7,17 may be applied in several deposition steps. After provision of the dielectric layer, a photolithographic mask is applied, so as to etch parts of the dielectric layers 7, 17. The etching is preferably a wet-etching treatment, wherein the metals act as etch stop layers. Etching treatments are known per se from U.S. Pat. No. 4,759,823. The design may be optimised to minimize the effects of underetching. The structure is then filled by applying a planarization layer. Inorganic and organic insulating layers known per se can be used. A suitable example appears to be silicon oxide or silicon nitride that is deposited. Instead of this single etch and planarisation treatment, such a treatment may be carried out for each dielectric layer separately. Use of a filler material that is stable up to the curing temperature of the second dielectric layer is however needed in that case. Many ferroelectric layers have a curing or conversion temperature of at least 600° C., and suitably about 800° C. Suitable fillers then are oxides and nitrides. The second conducting layer 10 is finally deposited, and an isolating material 85 is applied, in known manner. It is observed that the second conductive layer 10 may be applied locally on the first and second capacitor before deposition of the planarisation layer 84. It even could be applied before patterning of the underlying layers. Furthermore, an additional interconnect layer may be present on top of the isolating layer 85, locally extending through this isolating layer 85 to contact the capacitors, and optionally also other components, such as a diode defined in the substrate. The use of an interconnect layer in addition to the second conductive layer may be advantageous to fulfil requirements of adhesion to the dielectric and of internal resistance of the interconnect.

FIG. 4 shows in a cross-sectional view yet another embodiment. Herein, no floating electrode is present in the first capacitor 60, and the first and second dielectric layers 7,17 are fused into a single first dielectric 64. The second dielectric layer 17 is etched away outside the first and second capacitor 60,70, whereas the first dielectric layer 7 is continuous. As a result of the etching operation in which the second electrodes 62,72 and the intermediate electrode 73 are used as etching masks, some degree of etching of the first dielectric layer 7 outside the area of the capacitors 60, 70 may occur. The situation of a 30% reduction of the thickness, as shown in the Figure, is probably exaggerated. The use of the second electrodes 62,72 and the intermediate electrode 73 as etching masks allows for an efficient procedure with a minimum of masks. Nevertheless, it is still applicable to the class of ferroelectric materials with their high conversion temperatures. Another important difference is the use, in addition to a conductive layer, of a separate electrically conductive layer 10 as the interconnect layer in which the second electrodes 62,72 of the first and second capacitors 60,70 are defined. This is particularly suitable in case that a noble metal with a relatively high inner resistance is chosen as the material for these electrodes. Further vertical interconnects to the interconnect layer may be provided adjacent to the capacitor structure, so as to contact other components, such as a diode.

Additionally, not the intermediate electrode 73, but the first and second electrode 71,72 constitute the input of the second capacitor 70. This design appears less desirable, as, first of all, the resulting structure tends to have a larger surface area. Secondly, the first electrodes 61, 71 of the first and second capacitor 60, 70 will be charged substantially differently: the first electrode 61 of the first capacitor 60 is coupled to ground, whereas the first electrode 71 of the second capacitor 70 constitutes the input. In other words, the distance between the first electrodes 61,71 is bound to a clear minimum to prevent any breakdown at this location. Suitably, the distance is comparable to that of the thickness of the dielectric 64. It will be understood that each of these features, as explained with reference to FIGS. 3 and 4, may be combined separately.

In a further modification of this fourth embodiment, an additional resistor is present. This resistor is provided as another metal layer with a higher sheet resistance than the interconnect layer, and is suitably patterned to form the resistor of the circuit. The metal layer is for instance a layer of TiW, TiW(N), TiN, SiCr, SiCr(O), SiCr(N) or any other resistor material. The layer can be patterned in such a way that it only remains locally, i.e. where the resistor is formed, but alternatively it may remain not only on the regions of the resistor but also on top of the interconnect layer. It is preferably covered with a passivation layer. The resistor may be applied as well in modified device constructions, such as shown in the previous Figures, having a floating electrode in the first capacitor and a reversed input and output of the second capacitor.

FIG. 6 shows a top view of a fourth embodiment that is similar to the third embodiment. A major difference is that no additional interconnect layer is present. In this Figure, the lines are used in the same manner as in FIG. 5. In this embodiment, there is only one output 82 to the structure, and suitably, but not necessarily, said output is connected to ground. As a result thereof, there is a lead 19 from the intermediate electrode 73 to the output 82.

FIG. 7 shows an electrical diagram corresponding to FIGS. 1 and 5. In this diagram, the electronic device is shown with its input 81 and its output 82 and a further output 83. It shows a circuit that is suitable as an ESD-protection circuit and as a bandpass filter. A diode 21, comprising the regions 2,3 as shown in FIG. 1, is the primary ESD-protection element. Suitably, it is a back-to-back (reverse series) diode, although a Zener diode, a front-to-back (series) diode, a pn diode or a floating diode could be used alternatively. The specific type of diode depends inter alia on the required voltage stability. In this embodiment, the diode is, for instance, designed so as to be able to withstand and handle voltage peaks of more than 60 V. A resistor 22 is placed in the signal path. Its value is usually 50Ω for high-frequency applications, while its value may lie in the range of 1 kΩ to 100 kΩ for audio applications. The first capacitor 60 is then connected in a first branch leading to the first output 82. This first output 82 is connected to ground. The first capacitor 60 has, for example, a capacitance of 0.7 nF and a breakdown voltage of above 60 V. The second capacitor 70 forms part of the second branch. This second capacitor 70 is connected to a further output 83, that is connected to an integrated circuit input. This second capacitor 70 has, for example, a capacitance of 7.3 nF and a breakdown voltage of over 30 V. In principle, in view of the electrode stacking, the capacitance is actually twice 3.65 nF.

It is observed that the first capacitance of 0.7 nF is sufficient, even for very high voltage pulses. A value of 16 kV is, for instance, prescribed for many applications within a mobile phone or other handheld apparatus. During such a high (16 kV) voltage ESD-event, the current through the ESD diode can reach several Amperes, leading to a voltage drop of up to 60V across the diode. The maximum voltage drop duration is about 10 ns to 50 ns. The voltage across the diode is the input voltage for the first RC stage. With a resistor 22 of 50Ω and a first capacitance of 0.7 nF, the time constant is 35 ns for the first branch. Even at a maximum time of 50 ns, the capacitor 60 will not reach said 60V and the voltage across the first capacitor 60 is the input of the second RC stage (i.e. second branch). The second branch has an additional resistance 23 of a few Ohms. This is particularly suitable if the second branch is coupled with its output 83 to ground. Consequently, its time constant is 53Ω*3.65 nF=190-200 ns. As the time-constant is higher than in the first stage, it is ensured that the capacitor 70 of the second branch does not face a voltage drop of more than 30V.

It is observed for clarity that the values shown in this example relate to a protection against 16 kV voltage pulses, which is combined with one or more protection diodes so as to achieve a reduction to about 60V. As stated before, the device of the invention can be suitably used for applications in which lower voltage pulses are expected, as well as for applications in which not the electrostatic discharge but variations in battery voltages or the like may be harmful for certain highly vulnerable capacitors.

Furthermore, it will be understood that the values of the capacitors in this example are not meant to be limiting the scope of the invention. For instance, the capacitance of the second capacitor could be as large as 100 nF, while the breakdown voltage is only 5V.

FIG. 8 shows a second embodiment of an ESD protection circuit corresponding to FIG. 6. Herein both the first capacitor 60 and the second capacitor 70 are present between the input 81 and the first output 82. Also in this embodiment, the first output 82 is connected to ground. The embodiment shows a classic first-order RC low-pass filter. The values for the capacitors and resistors can be chosen to be same as in FIG. 7.

In short, the integrated capacitor structure comprises a first branch with a first capacitor 60 and a second branch with a second capacitor 70. The second capacitor 70 has a higher capacitance density and a lower breakdown voltage than the first capacitor 60. The first branch has a shorter RC time constant than the second branch, such that a voltage peak will substantially follow the first branch. This first capacitor 60 has a sufficient capacity to store the charge of the voltage peak. In one embodiment, the second capacitor 70 is a stacked capacitor. The structure is suitable for ESD-protection and, for this purpose, may additionally comprise diodes 21 and resistors 22.

REFERENCE NUMERALS 1 substrate
2 first semiconductor regions
3 second semiconductor regions
4 insulating layer
5 barrier layer
6 first electrically conductive layer
7 first dielectric layer
8 first supply lead
9 second supply lead
10 second electrically conductive layer
11 passivation layer
12,13 contact holes
15 ground contact
17 second dielectric layer
18 resistance layer
19 third supply lead
21 diode
22 resistor
23 additional resistor
60 first capacitor
61 first electrode of first capacitor
62 second electrode of first capacitor
63 floating electrode
64 dielectric
65 via
70 second capacitor
71 first electrode of second capacitor
72 second electrode of second capacitor
73 intermediate electrode
81 input
82 output
83 further output
84 planarisation layer
85 isolating layer

The invention claimed is:

1. An electronic device provided with an integrated capacitor structure with an input and at least one output, which structure comprises a first branch and a second branch, which first branch is coupled between the input and the output of the structure and comprises a first capacitor, and which second branch is coupled to the input and comprises a second capacitor with a higher capacitance density and a lower breakdown voltage than the first capacitor, and wherein the first branch has a shorter RC time constant than the second branch, such that a pulsed voltage peak will substantially follow the first branch, the first capacitor having sufficient capacity to store the charge of the voltage peak.

2. An electronic device as claimed in claim 1, wherein the first capacitor and the second capacitor comprise a common first dielectric layer.

3. An electronic device as claimed in claim 1, wherein the larger RC time of the second branch is implemented with an additional resistor.

4. An electronic device as claimed in claim 1, wherein the second capacitor is a stacked capacitor, in which the first dielectric layer is present between a first electrode and an intermediate electrode and a second dielectric layer is present between a second electrode and the intermediate electrode, and in which the first and second electrode of the second capacitor are mutually coupled.

5. An electronic device as claimed in claim 4, wherein the dielectric of the first capacitor comprises both the first and the second dielectric layer.

6. An electronic device as claimed in claim 3, wherein the first and second dielectric layers comprise a ferroelectric material.

7. An electronic device as claimed in claim 1, wherein the second capacitor is a trench capacitor.

8. An electronic device as claimed in claim 1, wherein the capacitor structure forms part of an ESD protection circuit further comprising a diode.

9. An electronic device as claimed in claim 8, further comprising a resistor.

10. An electronic device as claimed in claim 1, wherein the second branch is coupled to a further output of the structure.

11. An electronic device as claimed in claim 1, wherein the input of the capacitor structure is coupled to a contact pad of the electronic device, which contact pad is designed to provide a connection from the electronic device to another electronic device with a system.

12. An electronic device as claimed in claim 11, wherein the capacitor structure is the primary ESD-protection circuit for the contact pad, and is substantially free of diodes.

13. An assembly comprising the electronic device as claimed in claim 1 and an integrated circuit to be protected by the electronic device against electrostatic discharge (ESD).

14. Use of the electronic device as claimed in claim 1 for ESD protection of an electronic circuit and for filtering of signals with the second capacitor.

15. Use as claimed in claim 14, wherein the second capacitor is used for AC coupling of an audio or video signal.

* * * * *